United States Patent
Campione et al.

(10) Patent No.: US 11,017,186 B2
(45) Date of Patent: May 25, 2021

(54) OPTICAL DEVICES ENABLED BY VERTICAL DIELECTRIC MIE RESONATORS

(71) Applicant: National Technology & Engineering Solutions of Sandia, LLC, Albuquerque, NM (US)

(72) Inventors: Salvatore Campione, Albuquerque, NM (US); Michael B. Sinclair, Albuquerque, NM (US); Igal Brener, Albuquerque, NM (US); D. Bruce Burckel, Albuquerque, NM (US); Aaron J. Pung, Albuquerque, NM (US); Michael D. Goldflam, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 222 days.

(21) Appl. No.: 16/369,218

(22) Filed: Mar. 29, 2019

(65) Prior Publication Data

US 2020/0249451 A1    Aug. 6, 2020

Related U.S. Application Data

(60) Provisional application No. 62/802,051, filed on Feb. 6, 2019.

(51) Int. Cl.
*G06K 7/10*   (2006.01)
*G02B 17/00*   (2006.01)
(Continued)

(52) U.S. Cl.
CPC ............. *G06K 7/10* (2013.01); *G02B 1/002* (2013.01); *G02B 17/004* (2013.01); *G03F 7/7015* (2013.01)

(58) Field of Classification Search
CPC ..... G02B 17/004; G02B 1/002; G03F 7/7015; G06K 7/10
See application file for complete search history.

(56) References Cited

U.S. PATENT DOCUMENTS

| 8,981,337 B1 | 3/2015 | Burckel et al. |
| 9,190,736 B1 | 11/2015 | Burckel et al. |
(Continued)

OTHER PUBLICATIONS

Capretti, A., Lesage, A., & Gregorkiewicz, T. (2017). Integrating Quantum Dots and Dielectric Mie Resonators: A Hierarchical Metamaterial Inheriting the Best of Both. ACS photonics, 4(9), 2187-2196. https://doi.org/10.1021/acsphotonics.7b00320 (Year: 2017).*

(Continued)

*Primary Examiner* — William R Alexander
*Assistant Examiner* — Tamara Y. Washington
(74) *Attorney, Agent, or Firm* — Kevin W. Bieg

(57) ABSTRACT

Dielectric resonators provide a building block for the development of low-loss resonant metamaterials because they replace lossy ohmic currents of metallic resonators with low-loss displacement currents. The spectral locations of electric and magnetic dipole resonances of a dielectric resonator can be tuned by varying the resonator geometry so that desired scattering properties are achieved.

12 Claims, 12 Drawing Sheets

(51) Int. Cl.
  *G03F 7/20* (2006.01)
  *G02B 1/00* (2006.01)

(56) References Cited

U.S. PATENT DOCUMENTS

| | | | |
|---|---|---|---|
| 9,448,336 B1 | 9/2016 | Burckel et al. | |
| 10,529,003 B2* | 1/2020 | Mazed | H04W 4/029 |
| 10,785,859 B2* | 9/2020 | Loertscher | H05G 2/008 |
| 2016/0261086 A1* | 9/2016 | Pruned | G02F 1/21 |
| 2020/0200955 A1* | 6/2020 | Lopez-Julia | G02B 1/005 |

OTHER PUBLICATIONS

Burckel, D.B., Wendt, J.R., Ten Eyck, G.A., Ellis, A.R., Brener, I. and Sinclair, M.B. (2010), Fabrication of 3D Metamaterial Resonators Using Self-Aligned Membrane Projection Lithography. Adv. Mater., 22: 3171-3175. https://doi.org/10.1002/adma.200904153 (Year: 2010).*

Burckel, D.B. et al., "Micrometer-Scale Cubic Unit Cell 3D Metamaterial Layers", Advanced Materials, 2010, pp. 5053-5057, vol. 22.

Ginn, J.C. et al., "Realizing Optical Magnetism from Dielectric Metamaterials", Physical Review Letters, 2012, D97402-1-097402-5, vol. 108.

Campione, S. et al., "Tailoring Dielectric Resonator Geometries for Directional Scattering and Huygens' Metasurfaces", Optics Express, 2015, pp. 2293-2307, vol. 23.

Burckel, D.B. et al., "Three-dimensional cut wire pair behavior and controllable bianisotropic response in vertically oriented meta-atoms", Optics Express, 2017, pp. 32198-32205, vol. 25.

* cited by examiner

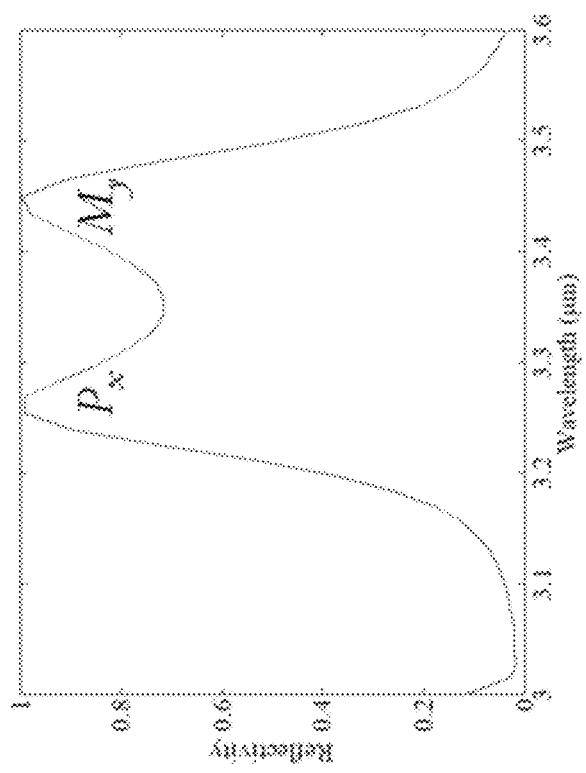
FIG. 6A
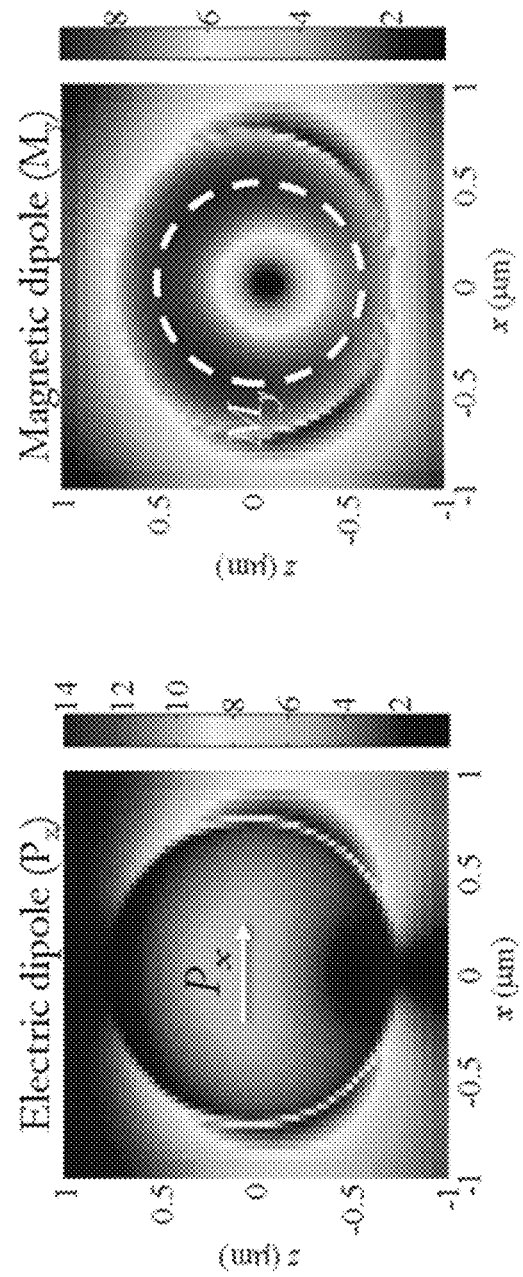
FIG. 6B
FIG. 6C

OPTICAL DEVICES ENABLED BY VERTICAL DIELECTRIC MIE RESONATORS

CROSS-REFERENCE TO RELATED APPLICATION

This application claims the benefit of U.S. Provisional Application No. 62/802,051, filed Feb. 6, 2019, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to metamaterials and, in particular, to optical devices enabled by vertical dielectric Mie resonators.

BACKGROUND OF THE INVENTION

Metamaterials play a crucial role in the development of micrometer-scale devices for a wide variety of applications, including electromagnetic cloaking, perfect absorption ranging from microwave to optical frequencies, and ultrasensitive terahertz sensing. See D. Schurig et al., *Science* 314, 977 (2006); N. I. Landy et al., *Phys. Rev. Lett.* 100, 207402 (2008); H. Tao et al., *Phys. Rev. B* 78, 241103 (2008); N. Liu et al., *Nano Lett.* 10, 2342 (2010); J. Hao et al., *Appl. Phys. Lett.* 96, 251104 (2010); X. Liu et al., *Phys. Rev. Lett.* 104, 207403 (2010); F. Ding et al., *Appl. Phys. Lett.* 100, 103506 (2012); T. S. Luk et al., *Phys. Rev. B* 90, 085411 (2014); B. X. Khuyen et al., *Curr. Appl. Phys.* 16(9), 1009 (2016); I. Faniayeu and V. Mizeikis, *Appl. Phys. Express* 10(6), 062001 (2017); B. X. Khuyen et al., *Sci. Rep.* 7, 45151 (2017); Y. Zhang et al., *J. Alloys Compd.* 705, 262 (2017); W. Wang et al., *J. Phys. D: Appl. Phys.* 50, 135108 (2017); D. Hasan et al., *ACS Photonics* 4(2), 302 (2017); and W. Wang et al., *Photon. Res.* 5(6), 571 (2017). The infrared regime is particularly interesting, based on the abundance of vibrational modes supported by the resonators, as well as the breadth of applications, such as sensing, detection, tunable devices, and imaging. See E. Cubukcu et al., *Appl. Phys. Lett.* 95, 043113 (2009); X. Xu et al., *Nano Lett.* 11(8), 3232 (2011); A. Ishikawa and T. Tanaka, *Sci. Rep.* 5, 12570 (2017); W. Yue et al., *Nanotechnology* 27, 055303 (2016); and J. A. Montoya et al., *Opt. Express* 25(19), 23343 (2017). However, conventional metallic resonators, such as split-ring resonators, exhibit high intrinsic ohmic losses that preclude their use in resonant metamaterials operating at infrared and higher frequencies.

SUMMARY OF THE INVENTION

The present invention is directed to arrays of vertically oriented dielectric Mie resonators that can provide low-loss resonant metamaterials because they replace lossy ohmic currents of metallic resonators with low-loss displacement currents. For example, using Membrane Projection Lithography (MPL), dielectric resonators can be placed on multiple walls within a single unit cell, and vertically stacked to provide additional functionality. Each resonator can be tailored to simultaneously exhibit high transmission and a large phase delay in the transmitted field. Vertically stacking the resonators can provide cumulative phase delay, while placing the resonators on opposite walls can provide cut-wire behavior from all-dielectric structures. In contrast to the highly transmissive devices, the latter design can provide band-stop filter behavior.

Novel geometries based on vertical dielectric Mie resonators can be achieved using MPL. Starting with high-symmetry geometries, such as high-index nanodisks on a low-index wall, the geometry can be modified to nanoellipses to move the magnetic dipole resonance toward the electric dipole resonance to achieve spectral overlap. High-index resonators can be used to enable directional scattering at the single resonator level and ultra-lightweight optical devices, such as lensing or wave-front manipulation with Huygens metasurfaces. The devices can provide high transmission for wide bands in the infrared. Furthermore, multiple dielectric resonators can be used to widen the bandwidth as well as achieve more than $2\pi$ phase shift, enabling next generation optical devices as well as aberration control.

BRIEF DESCRIPTION OF THE DRAWINGS

The detailed description will refer to the following drawings, wherein like elements are referred to by like numbers.

FIG. 6A is a plot of spectral reflectivity for a vertical dielectric Mie resonator with $r_1=r_2=750$ nm. The peaks indicate the electric ($P_x$) and magnetic ($M_y$) dipole resonances, respectively. The field profiles for each of these resonances are shown in FIGS. 6B and 6C.

FIG. 7A: $r_2=650$ nm, FIG. 7B: $r_2=530$ nm, and FIG. 7C: $r_2=400$ nm. In all cases, $r_1=750$ nm.

DETAILED DESCRIPTION OF THE INVENTION

Figure 1:
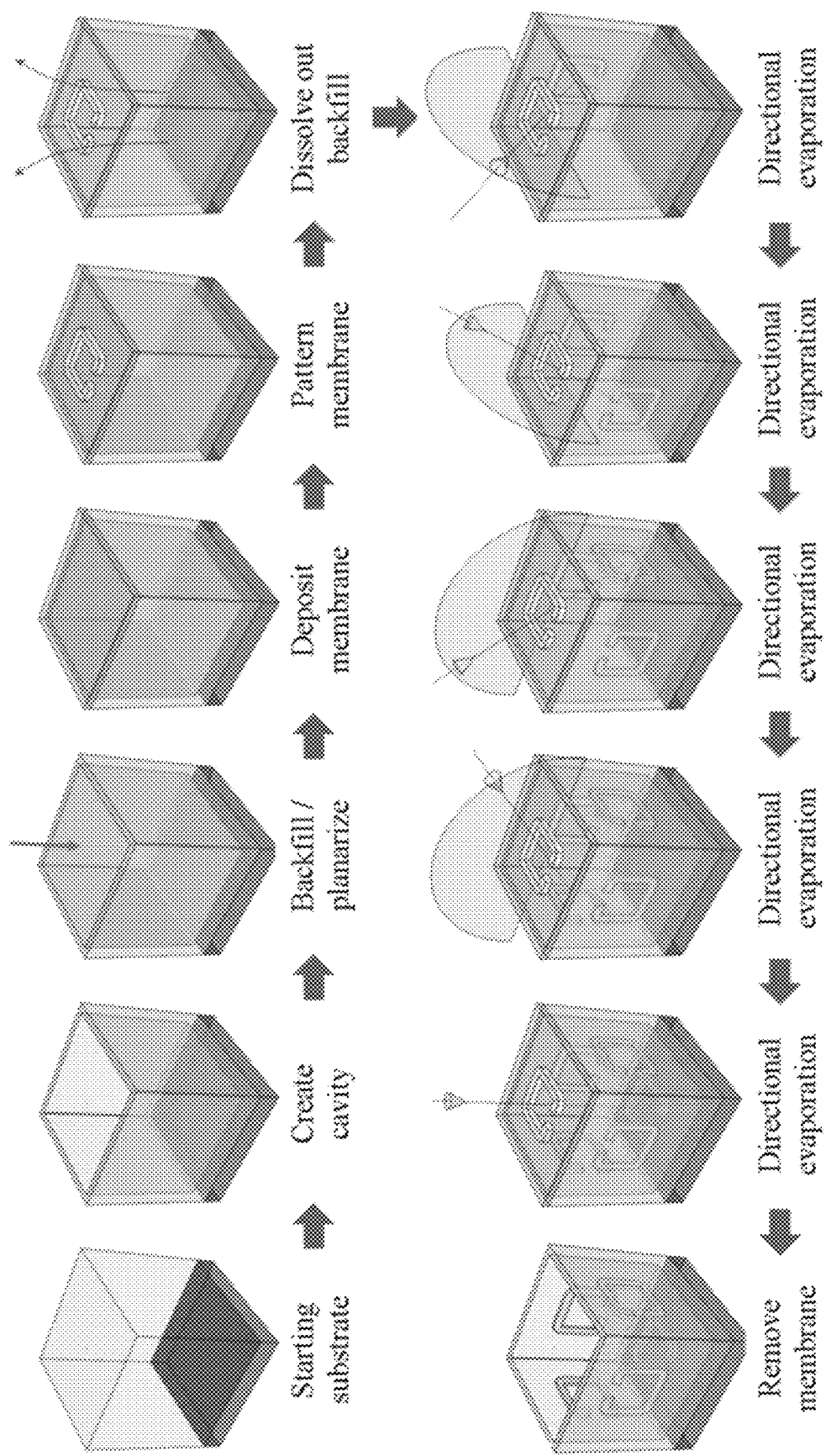
FIG. 1 is a schematic illustration of the Membrane Projection Lithography (MPL) process. The figure illustrates a perspective view of a single unit cell of a periodic lattice.

MPL alleviates the need to bind resonant structures to the horizontal surface of a planar substrate. See D. B. Burckel et al., *Adv. Mater.* 22(44), 5053 (2010); David Bruce Burckel at al., U.S. Pat. No. 8,981,337, issued Mar. 17, 2015; David B. Burckel and Gregory A. Ten Eyck, U.S. Pat. No. 9,190,736, issued Nov. 17, 2015; and David Bruce Burckel and Gregory A. Ten Eyck, U.S. Pat. No. 9,448,336, issued Sep. 20, 2016; which are incorporated herein by reference. As shown in FIG. 1, the MPL process begins by etching a periodic lattice, or array, of cavities into a substrate prior to backfilling the newly etched region with a sacrificial material. The substrate can comprise a low-index material (refractive index preferably less than 1.5), such as silicon dioxide, silicon nitride, silicon carbide, aluminum oxide, or aluminum nitride. Such a low index substrate is necessary to retain the original Mie modes of the dielectric resonators. See J. C. Ginn et al., *Phys. Rev. Lett.* 108(9), 097402 (2012). The cavity-forming etched substrate can optionally be supported on another substrate, as shown. In general, the cavity can be etched to have a particular shape, such as cubic (as shown), spherical (or hemispherical), cylindrical, rectangular, ellipsoidal, pyramidal, etc. The surface of the backfilled substrate is chemically mechanically planarized, followed by the deposition of a membrane material. The membrane is lithographically patterned with the shape of the resonator, creating an opening in the membrane. The sacrificial backfill material is removed from the cavity through the opening in the membrane, resulting in a patterned membrane suspended over each unit cell of the periodic lattice. Directional evaporation is then used to pattern the underlying resonator topology with the desired shape. For example, the dielectric resonator can have an elliptical or rectangular geometry. The resonators can comprise a high-index material (refractive index preferably greater than 3), such as silicon, germanium, SiGe, or a chalcogenide or chalcogenide alloy, such as tellurium, PbTe, or GeSnSbTe (GSST). The supporting substrate can be removed to provide a honeycomb structure comprising an array of hollow cells formed between thin vertical walls in a free-standing membrane of the etched substrate material. The array can be repeated in a layer-by-layer fashion to fabricate three-dimensional, volumetric arrays. Such arrays enable optical devices that can preferably operate in the infrared (e.g., 0.5 to 50 µm wavelengths) and, more preferably, in the near- and mid-infrared.

Figure 2:
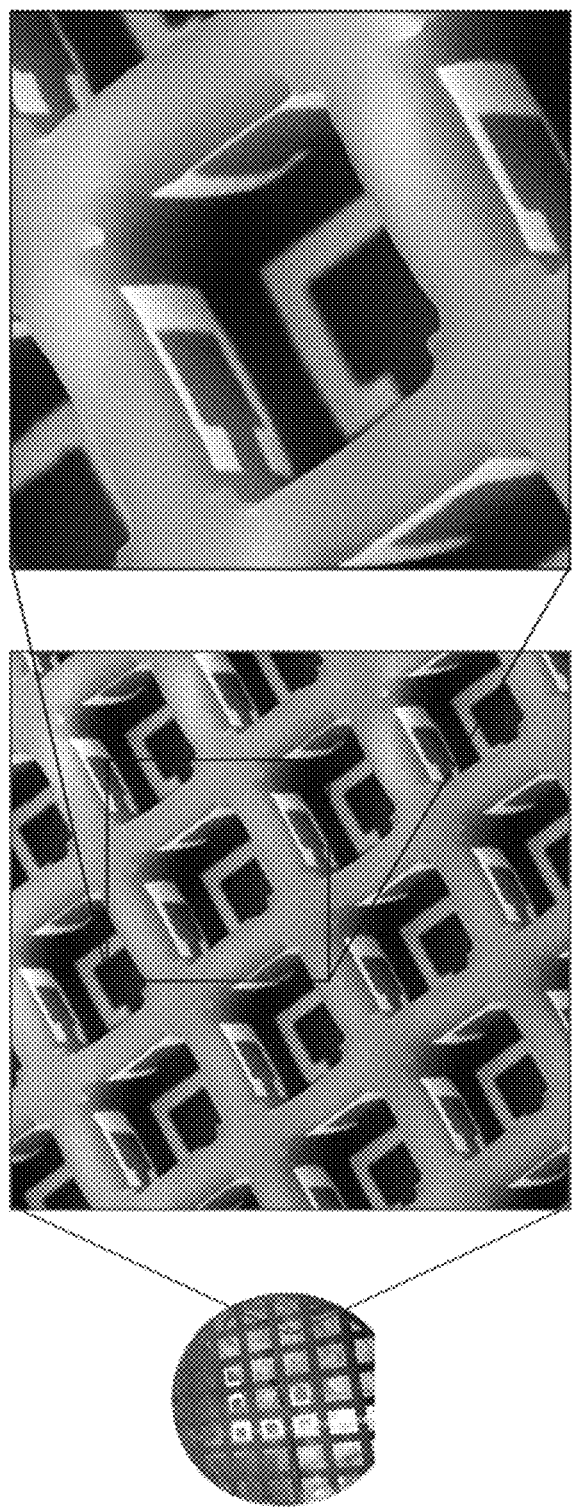
FIG. 2 is a scanning electron micrograph (SEM) image of a fully decorated unit cell.

Directional evaporation is key to enabling the vertical offset of the dielectric resonators from the surface. Additionally, MPL unlocks degrees of freedom for the resonator design, including rotation about the axis orthogonal to the broad face of the resonator and the ability to have multiple resonators in a given unit cell. Spatial dimensions of the resonators can be customized based on the angle of projection and evaporation during the fabrication process. The dimensions and distance between nearby resonators are important factors when studying electromagnetic coupling between the resonators. While similar micro-structures could be constructed using micro-origami or self-folding, these methods require additional steps following the microfabrication process. Instead, the etching, backfill, and evaporation steps are streamlined as a part of the MPL process. An example of a fully decorated unit cell (with plasmonic metal resonators) is shown in FIG. 2.

Figure 3:
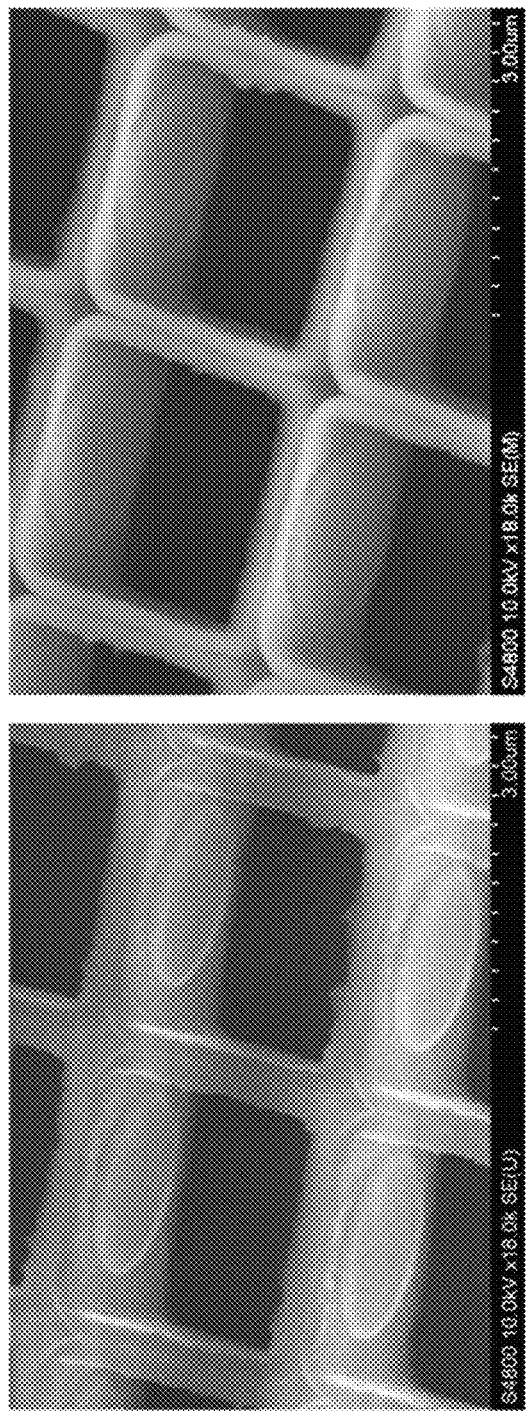
FIG. 3A is a SEM of germanium Mie resonators decorating silicon nitride walls, supported by a silicon substrate.
FIG. 3B is an SEM of silicon Mie resonators decorating silicon nitride walls, supported by a silicon substrate.
Figure 4:
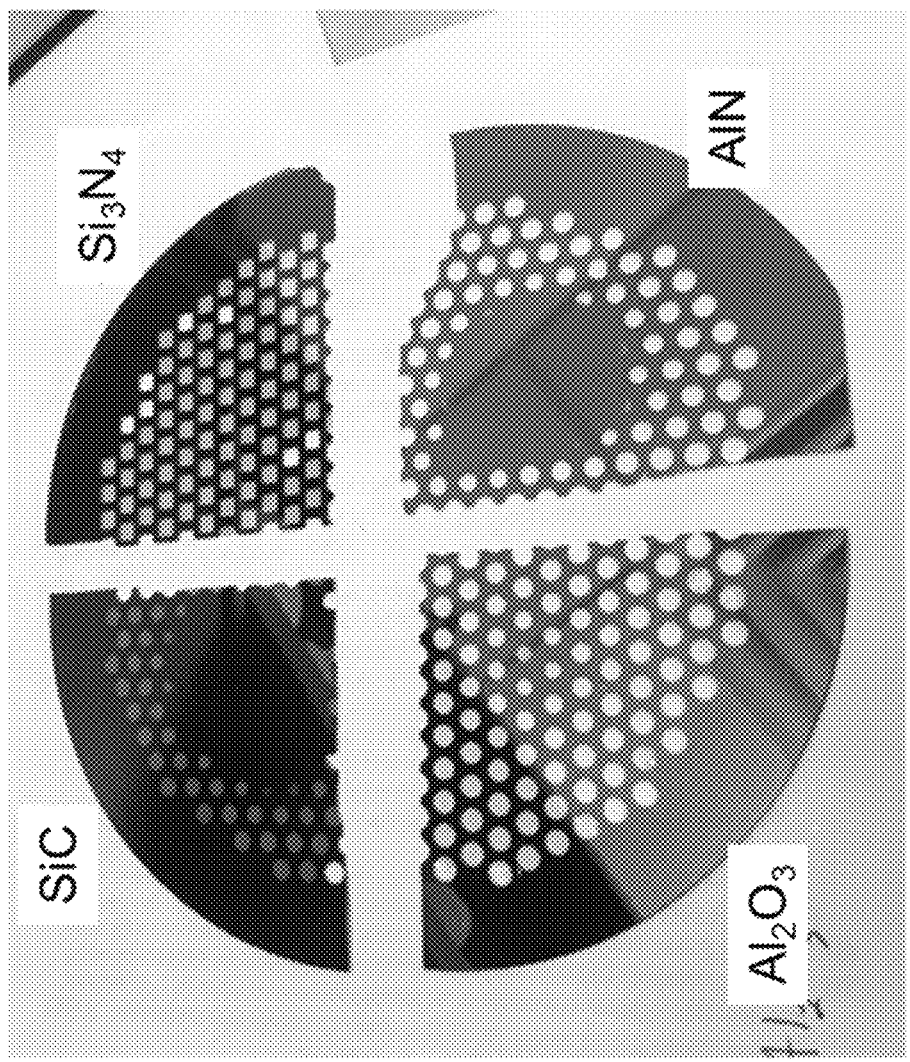
FIG. 4 shows photographs of through-hole cells formed in low-index, free-standing membranes of silicon carbide, silicon nitride, aluminum oxide, and aluminum nitride.

During the lithographic process, the final geometry relies heavily on the pattern placed on the membrane as well as the materials available for directional evaporation. For instance, while non-planar dielectric resonators can be placed vertically on one or more sidewalls of the unit cell, the high-index material of the resonator can be changed. FIGS. 3A and 3B show arrays of germanium and silicon Mie resonators placed on silicon nitride sidewalls, supported by a silicon substrate. The underlying silicon substrate can be removed, placing the resonators on a free-standing honeycombed membrane. FIG. 4 shows photographs of through-holes formed in free-standing membranes of low-index silicon carbide, silicon nitride, aluminum oxide, and aluminum nitride. This can provide optical elements both in reflection and transmission.

Single Resonator

Figure 5:
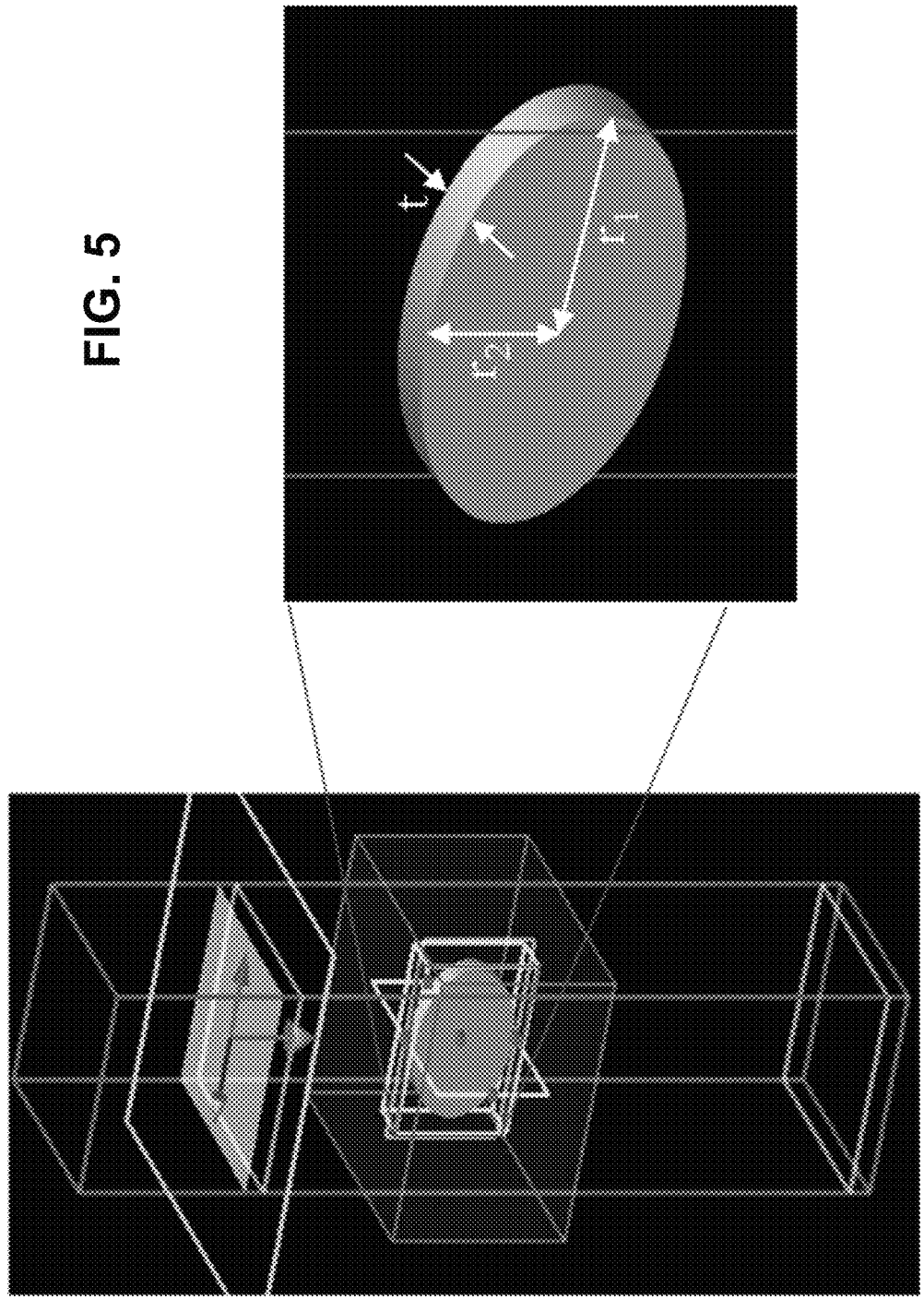
FIG. 5 is a schematic illustration of a sample Lumerical geometry of an isolated vertical dielectric resonator. The resonator is defined by a major radius, $r_1$, minor radius, $r_2$, and thickness, t.

Initially, an array of isolated vertical dielectric resonators was analyzed, each 200 nanometers thick and suspended in free space. The unit cell is considered to be subwavelength to the incident light and infinitely periodic in both planar orthogonal directions. The incident field is perpendicular to the plane of the array (i.e., parallel to $r_2$). The spectral power, transmittance, and transmitted phase were examined between 3.0-3.6 µm for four resonator geometries; each of the elliptical resonator geometries has a constant major radius ($r_1$=750 nm). The simulation geometry is shown in FIG. 5. The vertical dielectric resonators were analyzed using Lumerical FDTD software and rigorous coupled-wave analysis (RCWA). See D. Systemes, Lumerical fdtd solutions. URL www.cst.com/2017; I. Lumerical, Cst microwave studio suite 2017. URL www.lumerical.com/tcad-products/fdtd. Given that the results were in perfect agreement, only results from the Lumerical simulations are described below.

When the major and minor radii are the same ($r_1$=$r_2$=750 nm), two distinct peaks are observed in the spectral reflectivity. Multipole expansion analysis reveals these to be the electric and magnetic dipole resonances, characteristic of a Mie resonator. The spectral reflectivity and resonant field profiles for each peak are shown in FIGS. 6A-C.

Figure 7A:
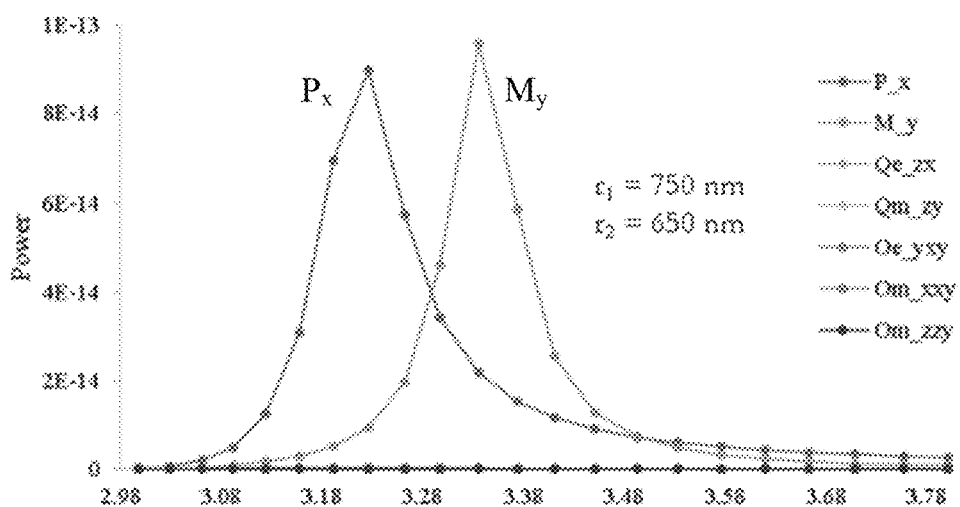
FIGS. 7A-C are plots of spectral power for three resonator geometries.

The Mie resonances are tunable by changing the dimensions of the dielectric resonators. Further analysis of multipole contributions to the spectral power were performed for three additional values of the minor radius: 650 nm, 530 nm, and 400 nm. These are plotted in FIGS. 7A-C. In each case, the major radius is unchanged ($r_1$=750 nm). Each plot contains contributions of the top seven contributors to the spectral power, including the electric and magnetic dipole (P, M), quadrupoles ($Q_e$, $Q_m$), and octupoles ($O_e$, $O_m$). Only the dipole contributions are significant.

Figure 7B:
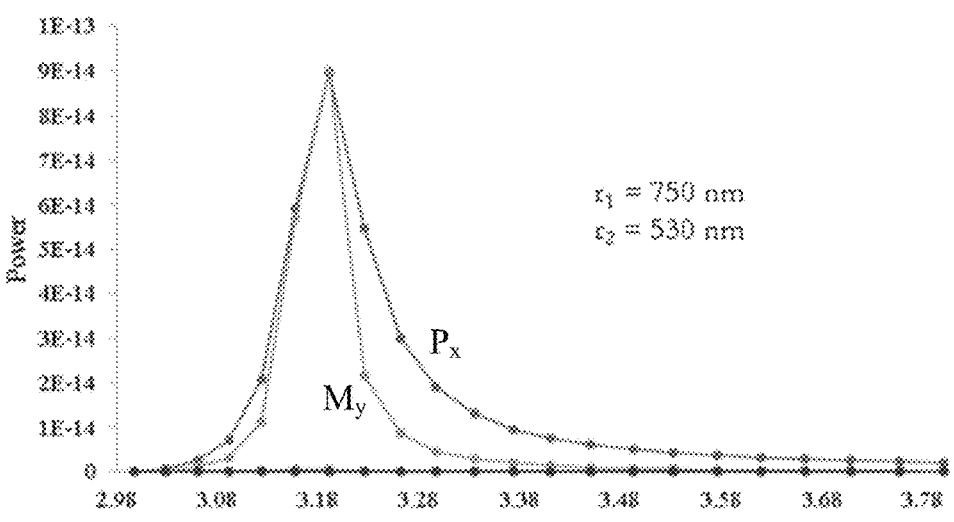
Figure 7C:
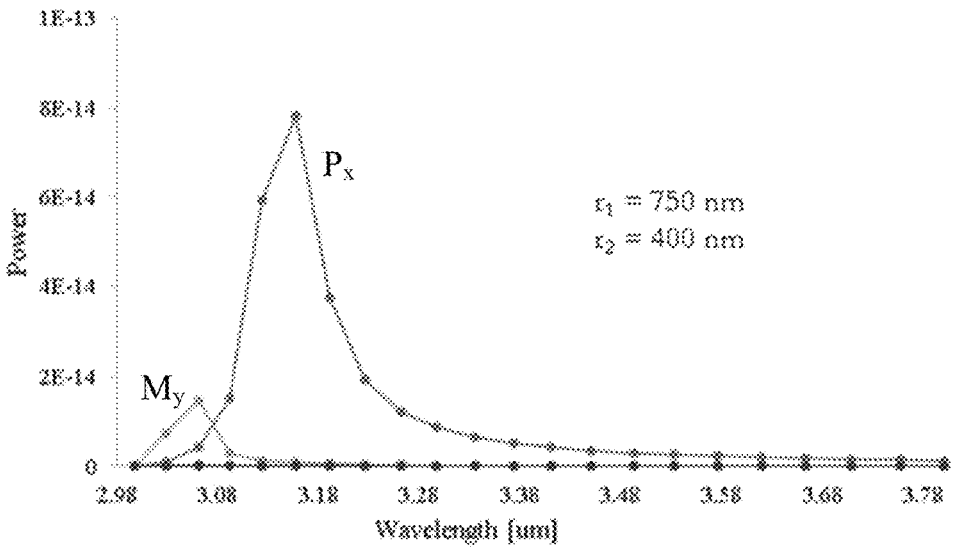
Figure 8:
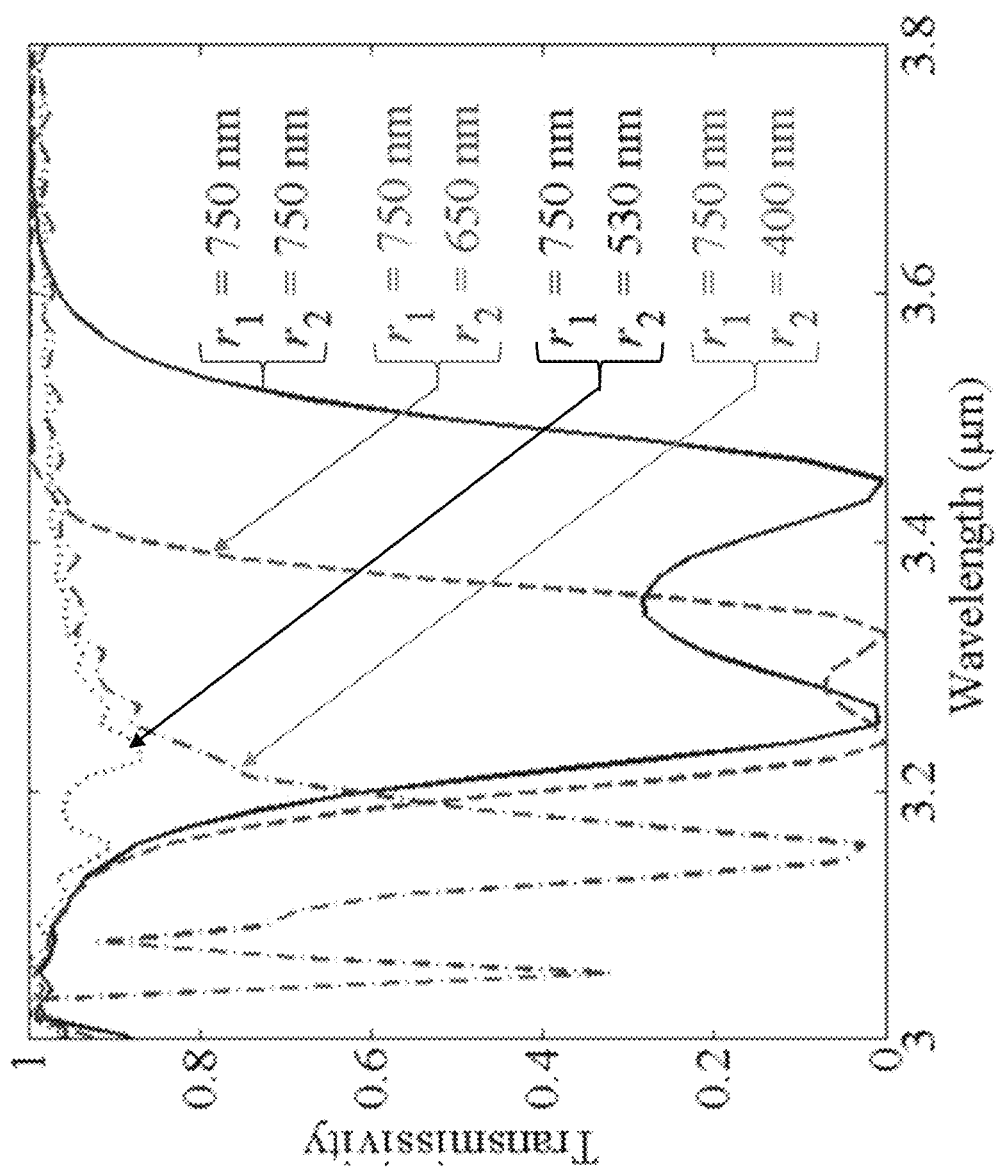
FIG. 8 is a plot of spectral transmissivity for each resonator geometry.

As the minor radius is decreased, the electric and magnetic resonances spectrally converge. As shown in FIG. 7B, when $r_1$=750 nm and $r_2$=530 nm, the electric and magnetic dipole resonances overlap, satisfying the first Kerker condition and leading to a Huygens' resonator, enabling maximum forward scattering. See S. Campione et al., *Opt. Express* 23(3), 2293 (2015). As shown in FIG. 8, similar behavior is seen in the spectral transmissivity, except that the resonator array becomes highly transmissive when the resonances overlap ($r_1$=750 nm and $r_2$=530 nm). Other, more complex optical behaviors can be achieved by controlling the multipoles exhibited by the dielectric resonator, enabling novel optical devices.

Figure 9:
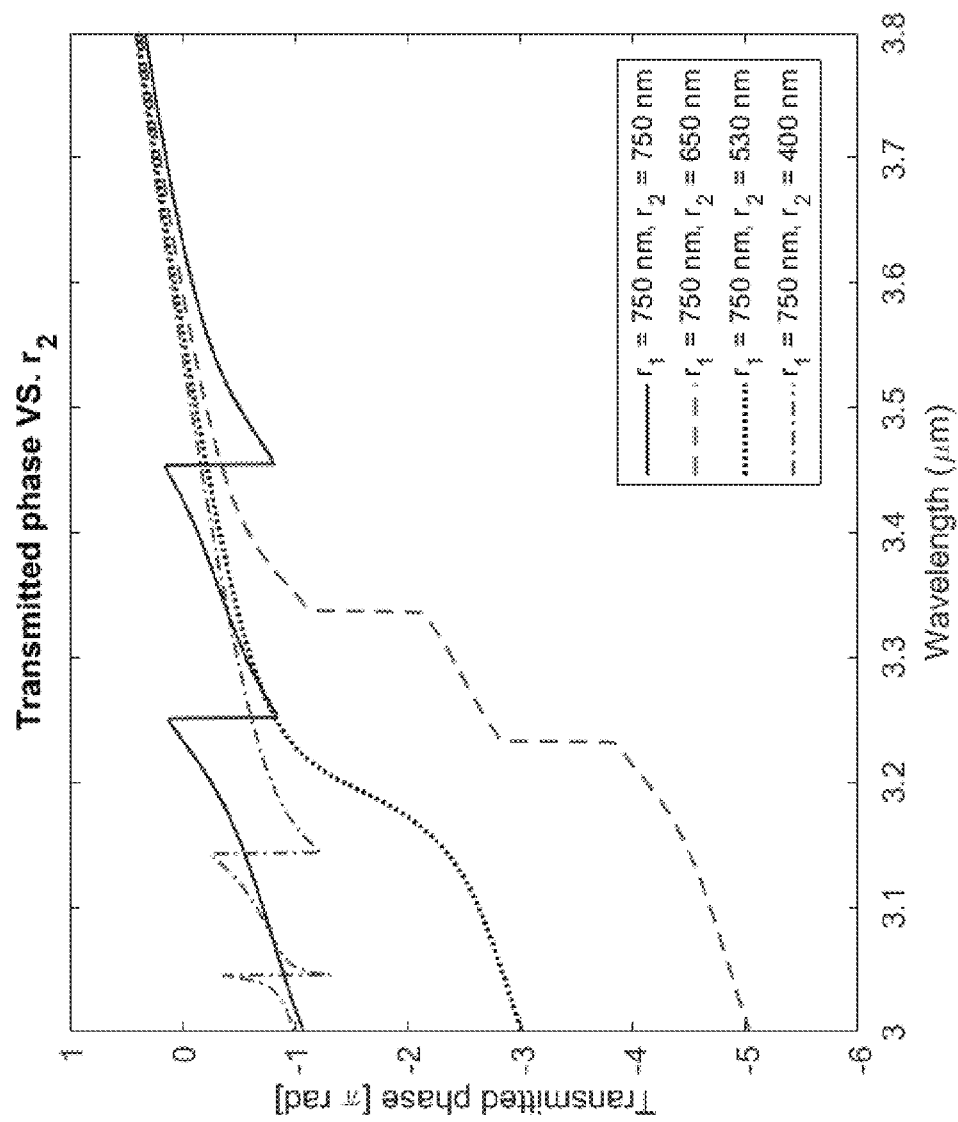
FIG. 9 is a plot of the (unwrapped) phase of the transmitted field for each of the resonator geometries.

The phase of the transmitted field was also investigated. At resonance, the vertical Huygens' dielectric resonators are found to produce a phase shift of larger than $2\pi$, as shown in FIG. 9. In particular, when the resonances overlay, the array provides a large transmissivity together with a large continuous phase shift.

Multiple Resonators: Back-to-Back

Figure 10B:
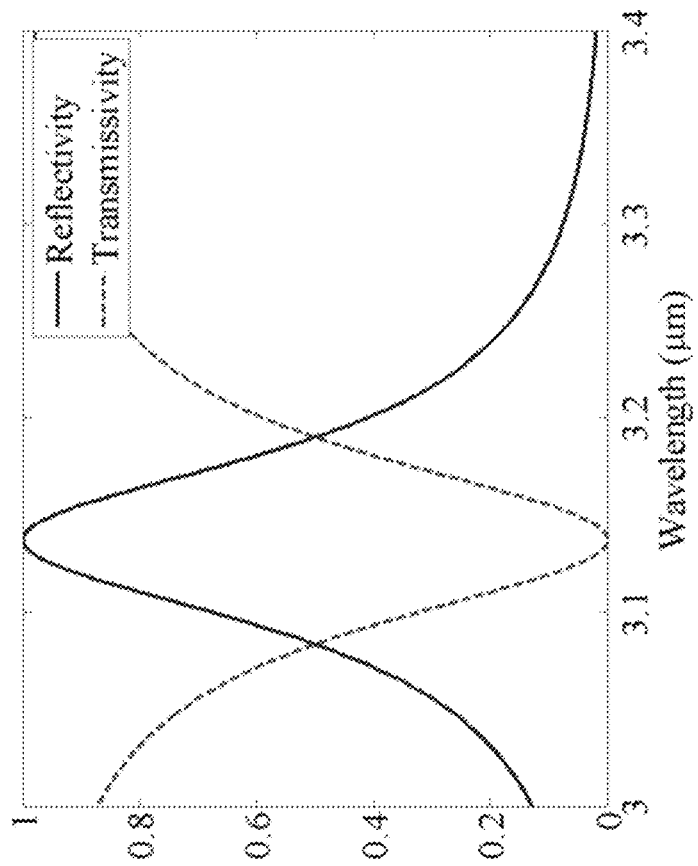
FIG. 10B is a graph of the spectral response of the back-to-back geometry.
Figure 10A:
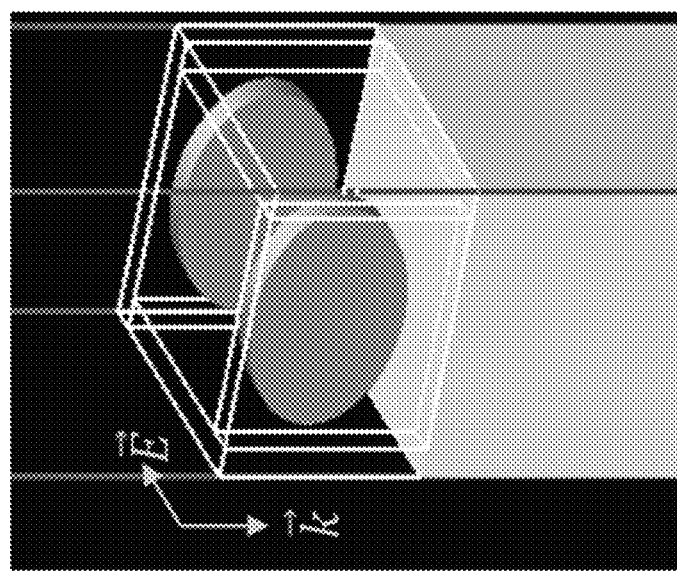
FIG. 10A is an illustration of a back-to-back vertical dielectric resonator geometry.

Based on the MPL fabrication technique, a single resonator design can be used to decorate multiple walls of the unit cell. Depending on the array design, the resonator design on each wall can be similar, but rotated. In the case of an elliptical design, opposite walls of the unit cell can be decorated with the same unrotated design. In this case, back-to-back vertical resonators are created, as illustrated in FIG. 10A. The silicon disks are 200 nm thick, separated by 400 nm thick silicon dioxide ($SiO_2$) walls. The major and minor radii of each disk are 750 nm, and the structure rests on a $SiO_2$ substrate. The spectral response of this geometry is shown in FIG. 10B.

Figure 11:
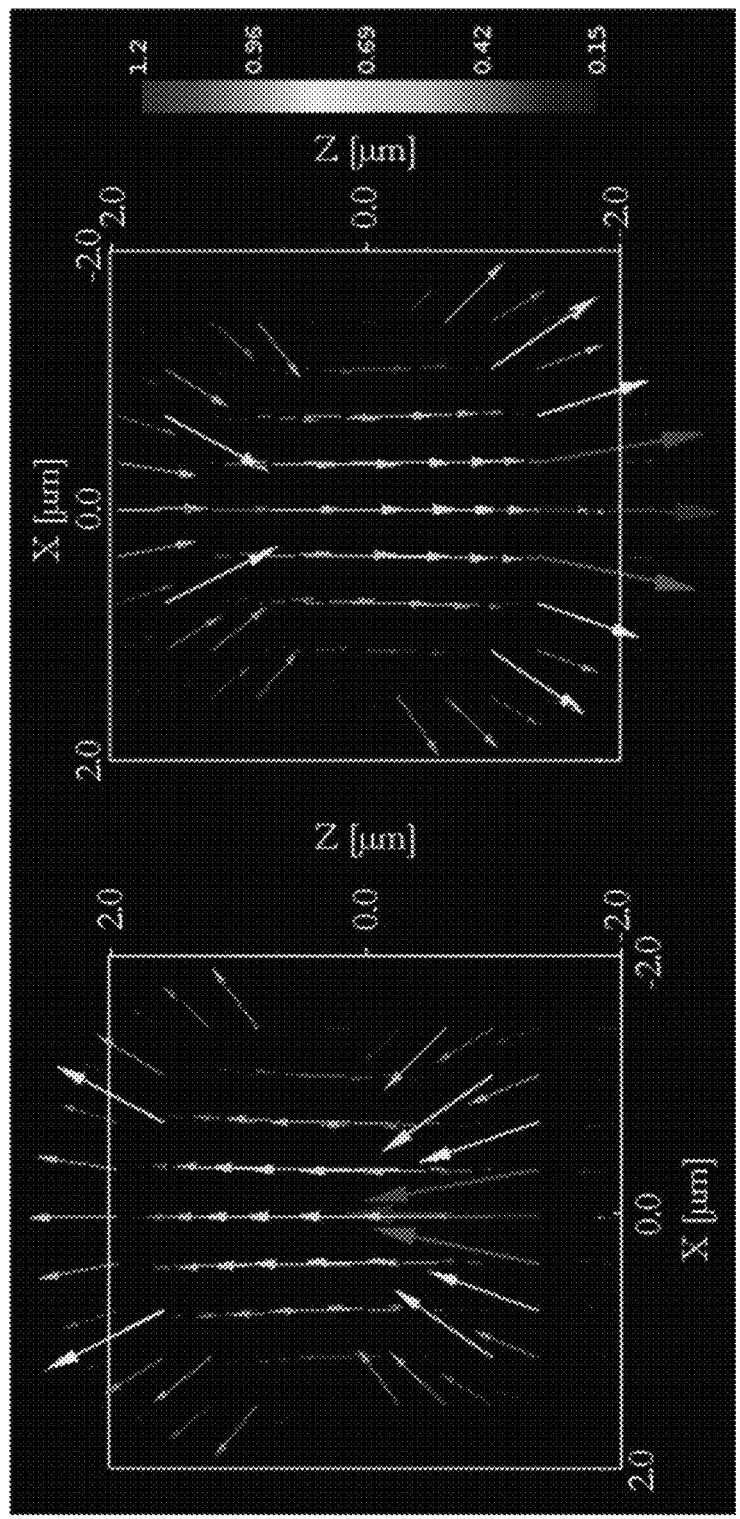
FIG. 11 is a plot of anti-parallel currents of the back-to-back geometry during device resonance.
Figure 12D:
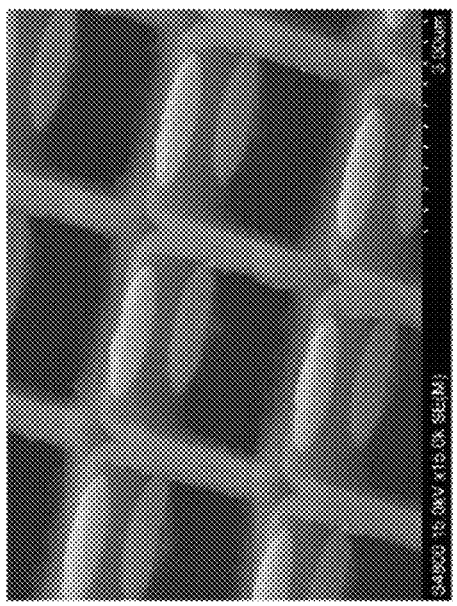
FIG. 12D is a SEM image of two vertically stacked dielectric resonators on a single wall of a unit cell, fabricated using MPL.
Figure 12C:
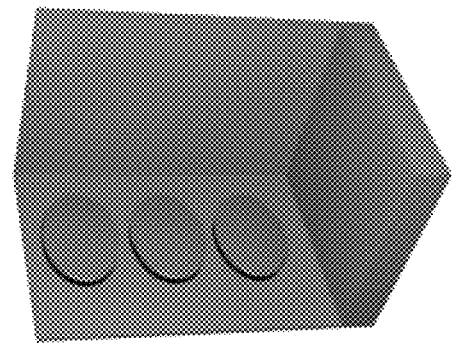
FIGS. 12A-C are conceptual illustrations of vertically stacked dielectric resonators on a single wall for 1, 2, and 3 resonators, respectively.
Figure 12B:
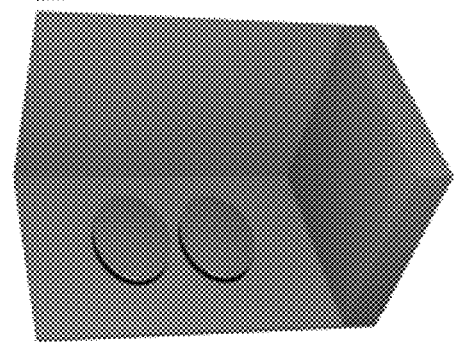
Figure 12A:
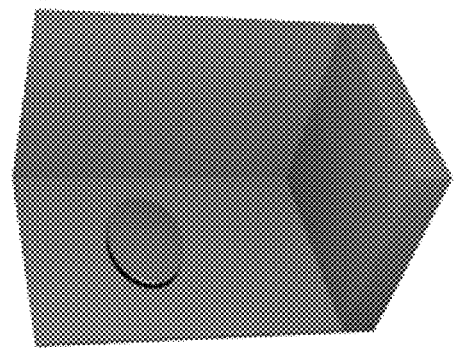

In this configuration the back-to-back dielectric resonators create an all dielectric cut-wire pair, supporting antiparallel currents and exhibiting band-stop filter behavior. See D. Bruce Burckel et al., *Opt. Express* 25(25), 32198 (2017). Plots of the anti-parallel currents are shown in FIG. 11. This constitutes a magnetic source that can be used as a building block for optical devices, such as filters.

Multiple Resonators: Vertically Stacked

Changing the design in the pattern membrane at the beginning of the MPL process further enables vertically stacking multiple resonators on a single wall of the unit cell. This geometry is illustrated in FIGS. 12A-D. Ideally, vertically stacking multiple dielectric disks enables phase accumulation, while still maintaining a highly-transmissive design, opening up the design space for more complex optical elements.

The present invention has been described as optical devices enabled by vertical dielectric Mie resonators. It will be understood that the above description is merely illustrative of the applications of the principles of the present invention, the scope of which is to be determined by the claims viewed in light of the specification. Other variants and modifications of the invention will be apparent to those of skill in the art.

We claim:

1. An optical device, comprising:
a periodic lattice of unit cells in a low-index substrate, each unit cell comprising a hollow cavity etched into the substrate wherein each cavity comprises one or more non-planar, high-index dielectric resonators deposited on at least one wall of the hollow cavity.

2. The optical device of claim 1, wherein the one or more non-planar, high-index dielectric resonators has an index of refraction greater than 3.

3. The optical device of claim 1, wherein the one or more non-planar, high-index dielectric resonator comprises germanium, silicon, chalcogenide, or a chalcogenide alloy.

4. The optical device of claim 1, wherein the one or more non-planar, high-index dielectric resonators have an elliptical or rectangular geometry.

5. The optical device of claim 4, wherein the major radius and minor radius of the elliptical or rectangular geometry are selected to provide Huygens' resonators.

6. The optical device of claim 1, where the one or more non-planar, high-index dielectric resonators comprises two resonators deposited on opposite walls of a unit cell, thereby providing back-to-back vertical resonators in the periodic lattice.

7. The optical device of claim 1, wherein the one or more non-planar, high-index dielectric resonators comprise two or more vertically stacked resonators.

8. The optical device of claim 1, wherein the hollow cavities are etched through the low-index substrate, thereby providing a honeycomb structure of through-hole unit cells in a thin membrane.

9. The optical device of claim 1, further comprising at least one additional periodic lattice of unit cells repeated in a layer-by-layer fashion to provide a three-dimensional volumetric array.

10. The optical device of claim 1, wherein the low-index substrate has an index of refraction less than 1.5.

11. The optical device of claim 1, wherein the low-index substrate comprises silicon dioxide, silicon carbide, silicon nitride, aluminum oxide, or aluminum nitride.

12. The optical device of claim 1, wherein the unit cells are subwavelength to an incident infrared light.

* * * * *